(12) United States Patent
Bing

(10) Patent No.: US 11,610,951 B2
(45) Date of Patent: Mar. 21, 2023

(54) DISPLAY PANEL AND METHOD FOR MANUFACTURING SAME

(71) Applicant: SHENZHEN CHINA STAR OPTOELECTRONICS SEMICONDUCTOR DISPLAY TECHNOLOGY CO., LTD., Guangdong (CN)

(72) Inventor: Yifei Bing, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 149 days.

(21) Appl. No.: 17/047,485

(22) PCT Filed: Jul. 14, 2020

(86) PCT No.: PCT/CN2020/101862
§ 371 (c)(1),
(2) Date: Oct. 14, 2020

(87) PCT Pub. No.: WO2021/243811
PCT Pub. Date: Dec. 9, 2021

(65) Prior Publication Data
US 2021/0384273 A1   Dec. 9, 2021

(30) Foreign Application Priority Data

Jun. 4, 2020   (CN) .......................... 202010498660.2

(51) Int. Cl.
*H01L 27/32*   (2006.01)
*H01L 51/56*   (2006.01)

(52) U.S. Cl.
CPC ...... *H01L 27/3246* (2013.01); *H01L 27/3216* (2013.01); *H01L 27/3218* (2013.01);
(Continued)

(58) Field of Classification Search
CPC ............. H01L 27/3216; H01L 27/3218; H01L 27/3246
See application file for complete search history.

(56) References Cited

U.S. PATENT DOCUMENTS 11,482,578 B2 * 10/2022 Yan ...................... H01L 51/5072
11,482,581 B2 * 10/2022 Kim ........................ H01L 51/56
(Continued)

FOREIGN PATENT DOCUMENTS

| CN | 102262854 A | 11/2011 |
|----|-------------|---------|
| CN | 107731871 A | 2/2018 |

(Continued)

OTHER PUBLICATIONS

Machine translation, Huo, Chinese Pat. Pub. No. CN107731871A, translation date: May 3, 2022, Espacenet, all pages. (Year: 2022).*
(Continued)

*Primary Examiner* — Victoria K. Hall
(74) *Attorney, Agent, or Firm* — The Roy Gross Law Firm, LLC; Roy Gross

(57) ABSTRACT

A display panel and a method for manufacturing the display panel are provided. The display panel includes a plurality of pixel units, wherein each of the pixel units includes first sub-pixels, second sub-pixels, third sub-pixels, first pixel definition layers, and a second pixel definition layer. Each of the pixel units is enclosed by one of the first pixel definition layers into a rectangle; and the second pixel definition layer is disposed in each of the first pixel definition layers and between the first sub-pixels, the second sub-pixels, and the third sub-pixels.

11 Claims, 4 Drawing Sheets

(52) U.S. Cl.
CPC .......... *H01L 27/3283* (2013.01); *H01L 51/56* (2013.01); *H01L 27/3211* (2013.01); *H01L 2251/558* (2013.01)

(56) References Cited

U.S. PATENT DOCUMENTS

| | | | |
|---|---|---|---|
| 2011/0291550 A1* | 12/2011 | Kim | H01L 27/3218 313/504 |
| 2014/0197396 A1* | 7/2014 | Madigan | H01L 51/5234 438/34 |
| 2014/0361965 A1* | 12/2014 | Cheng | H01L 27/3246 345/83 |
| 2015/0364712 A1* | 12/2015 | Lee | H01L 51/5209 257/40 |
| 2016/0276615 A1* | 9/2016 | Kitabayashi | H01L 51/5265 |
| 2018/0350888 A1* | 12/2018 | Huo | H01L 27/3246 |
| 2019/0363146 A1* | 11/2019 | Takahashi | H01L 51/5246 |
| 2020/0365673 A1* | 11/2020 | Kitabayashi | H01L 27/3262 |
| 2021/0013271 A1* | 1/2021 | Kim | H01L 27/3206 |
| 2021/0083016 A1* | 3/2021 | Yamabuchi | H01L 27/3218 |
| 2021/0132720 A1* | 5/2021 | Lee | H01L 27/3246 |
| 2022/0384539 A1* | 12/2022 | Liu | H01L 27/3246 |

FOREIGN PATENT DOCUMENTS

| | | | | |
|---|---|---|---|---|
| CN | 207409489 U | 5/2018 | | |
| CN | 108987431 A | 12/2018 | | |
| CN | 110085623 A | * 8/2019 | ......... | H01L 27/3246 |
| CN | 110085623 A | 8/2019 | | |

OTHER PUBLICATIONS

Machine translation, Chen, Chinese Pat. Pub. No. CN108987431A, translation date: May 3, 2022, Espacenet, all pages. (Year: 2022).*
Machine translation, Chen, Chinese Pat. Pub. No. CN110085623A, translation date: May 3, 2022, Espacenet, all pages. (Year: 2022).*
Machine translation, Luo, Chinese Pat. Pub. No. CN207409489u, translation date: May 3, 2022, Espacenet, all pages. (Year: 2022).*
Machine translation, Written Opinion of International Searching Authority (dated Feb. 23, 2021), International App. No. PCT/CN2020/101862, all pages. (Year: 2022).*
Written Opinion of International Searching Authority (dated Feb. 23, 2021), International App. No. PCT/CN2020/101862, all pages. (Year: 2021).*

* cited by examiner

DISPLAY PANEL AND METHOD FOR MANUFACTURING SAME

FIELD OF INVENTION

The present disclosure relates to the field of display technologies, and particularly relates to a display panel and a method for manufacturing the display panel.

BACKGROUND OF INVENTION

Conventional organic light-emitting diodes (OLEDs) are new current-type semiconductor light-emitting devices, which belong to a kind of autonomous light-emitting technology by controlling carriers of the devices and exciting organic materials to emit light. Compared with passively luminous liquid crystal display devices, self-luminous OLED display devices have advantages of fast response speed, high contrast, and wide viewing angles, and are easy to realize flexible display, making them generally favored by the industry. It has always been believed that OLED display devices are very likely to become mainstream products for a next generation of display technology.

The OLEDs have an anode, an organic functional layer, and a cathode sequentially formed on a substrate, wherein the organic functional layer generally includes a hole injection layer (HIL), a hole transport layer (HTL), an emitting functional layer (EML), an electron injection layer (EIL), and an electron transport layer (ETL). At present, each of functional material layers of the OLEDs and a cathode metal layer film are prepared by vacuum thermal evaporation process, that is, an organic small molecule material is heated in a vacuum chamber to sublime or melt and vaporize into material vapor, and the material vapor is deposited on a glass substrate through openings of a metal mask. However, due to a high cost of vacuum thermal evaporation process, large-scale commercialization of OLED displays is limited.

Ink-jet printing (IJP) has advantages of high material utilization and is a key technology to solving a cost problem of large-sized OLED display devices. This method generally uses multiple nozzles to drop functional material ink into predetermined pixel regions, and then a desired film is obtained by drying. On a substrate used in a printing film forming process, grooves are generally defined in designated pixel regions to limit ink. However, due to a solution process itself and a limitation of an accuracy of printing equipment, if dimensions of the grooves are too small, a mixing phenomenon of the solutions in different grooves will occur. An occurrence of this color miscibility phenomenon will cause obvious differences in brightness and chromaticity during display, which will seriously affect quality of products and limit an application prospect of the OLEDs produced by IJP and with high pixels per inch (PPI) density.

Therefore, in the conventional display panel technology, there are still problems that color miscibility between adjacent pixel units affects a display quality of a display panel and low luminous efficiency of blue sub-pixels, causing a bottleneck for mass production of IJP OLEDs. The problems need to be urgently solved.

Technical Problems

The present disclosure relates to a display panel configured to solve problems that color miscibility between adjacent pixel units affects a display quality of a display panel and low luminous efficiency of blue sub-pixels, causing a bottleneck for a mass production of IJP OLEDs.

Technical Solutions

In order to solve the above problems, technical solutions provided by the present disclosure are as follows:

The present disclosure provides a display panel, including a plurality of pixel units, first pixel definition layers being disposed between the plurality of pixel units, wherein each of the pixel units further includes: first sub-pixels, second sub-pixels, and third sub-pixels, wherein each of the pixel units is enclosed by one of the first pixel definition layers into a rectangle;

a second pixel definition layer is disposed between the first sub-pixels, the second sub-pixels, and the third sub-pixels, wherein the second pixel definition layer is disposed in each of the first pixel definition layers;

the third sub-pixels are blue pixels, and the first sub-pixels and the second sub-pixels are respectively one of red pixels or green pixels.

In an embodiment provided in the present disclosure, wherein areas of the third sub-pixels are greater than areas of the first sub-pixels, and areas of the first sub-pixels are same as areas of the second sub-pixels.

In an embodiment provided in the present disclosure, wherein in each of the pixel units, areas of the third sub-pixels are twice areas of the first sub-pixels, and areas of the third sub-pixels are twice areas of the second sub-pixels.

In an embodiment provided in the present disclosure, wherein in each of the pixel units, the first sub-pixels, the second sub-pixels, and the third sub-pixels are all semicircular.

In an embodiment provided in the present disclosure, wherein in each of the pixel units, areas of the third sub-pixels are four times areas of the first sub-pixels, and areas of the third sub-pixels are four times areas of the second sub-pixels.

In an embodiment provided in the present disclosure, wherein in each of the pixel units, shapes of the third sub-pixels are circles, and shapes of the first sub-pixels and the second sub-pixels are quarter-circles.

In an embodiment provided in the present disclosure, wherein in each of the pixel units, the third sub-pixels, the first sub-pixels, and the second sub-pixels are rectangles, areas of the third sub-pixels are four times areas of the first sub-pixels, and areas of the third sub-pixels are four times areas of the second sub-pixels.

In an embodiment provided in the present disclosure, wherein a height of the first pixel definition layers is greater than a height of the second pixel definition layers, and each of the first pixel definition layers and the second pixel definition layer has a certain preset thickness.

In an embodiment provided in the present disclosure, wherein the preset thickness of the first pixel definition layers ranges from 0.5 um to 1 um; the preset thickness of the second pixel definition layer ranges from 1 um to 2 um.

The present disclosure provides a display panel, including a plurality of pixel units, first pixel definition layers being disposed between the plurality of pixel units, wherein each of the pixel units further comprises: first sub-pixels, second sub-pixels, and third sub-pixels, wherein each of the pixel units is enclosed by one of the first pixel definition layers into a rectangle;

a second pixel definition layer is disposed between the first sub-pixels, the second sub-pixels, and the third sub-pixels, wherein the second pixel definition layer is disposed in each of the first pixel definition layers.

In an embodiment provided in the present disclosure, wherein areas of the third sub-pixels are greater than areas of the first sub-pixels, and areas of the first sub-pixels are same as areas of the second sub-pixels.

In an embodiment provided in the present disclosure, wherein in each of the pixel units, areas of the third sub-pixels are twice areas of the first sub-pixels, and areas of the third sub-pixels are twice areas of the second sub-pixels.

In an embodiment provided in the present disclosure, wherein in each of the pixel units, the first sub-pixels, the second sub-pixels, and the third sub-pixels are all semicircular.

In an embodiment provided in the present disclosure, wherein in each of the pixel units, areas of the third sub-pixels are four times areas of the first sub-pixels, and areas of the third sub-pixels are four times areas of the second sub-pixels.

In an embodiment provided in the present disclosure, wherein in each of the pixel units, shapes of the third sub-pixels are circles, and shapes of the first sub-pixels and the second sub-pixels are quarter-circles.

In an embodiment provided in the present disclosure, wherein in each of the pixel units, the third sub-pixels, the first sub-pixels, and the second sub-pixels are rectangles, areas of the third sub-pixels are four times areas of the first sub-pixels, and areas of the third sub-pixels are four times areas of the second sub-pixels.

In an embodiment provided in the present disclosure, wherein a height of the first pixel definition layers is greater than a height of the second pixel definition layers, and each of the first pixel definition layers and the second pixel definition layer has a certain preset thickness.

In an embodiment provided in the present disclosure, wherein the preset thickness of the first pixel definition layers ranges from 0.5 um to 1 um; the preset thickness of the second pixel definition layer ranges from 1 um to 2 um.

The present disclosure provides a method for manufacturing a display panel, wherein, the display panel adopts the above-mentioned display panel, and the method includes following steps:

S10, provide a substrate;

S20, forming a thin film transistor layer on a side of the substrate;

S30, forming an anode layer in each of sub-pixel units and on the side of the thin film transistor layer facing away from the substrate;

S40, forming a second pixel definition layer around the anode layer, wherein the sub-pixel units are separated from each other by the second pixel definition layer; and S50, forming first pixel definition layers around each of the pixel units, wherein a height of each of the first pixel definition layers is greater than a height of the second pixel definition layer.

Beneficial Effects

Compared with prior art, the display panel and the method for manufacturing the display panel provided by the present disclosure have beneficial effects as follows:

1. In the display panel provided by the present disclosure, the adjacent pixel units are separated by the first pixel definition layers, and each of pixel units are provided with a plurality of sub-pixels of different colors and sizes, wherein the areas of the third sub-pixels are greater than the areas of the first sub-pixels, and the areas of the third sub-pixels are further greater than the areas of the second sub-pixels. Therefore, luminous efficiency of the third sub-pixels in each of the pixel units is improved, thereby improving the display quality of the display panel.

2. In the method for manufacturing the display panel provided by the present disclosure, each of the pixel units is prepared by an ink-jet printing method, a material utilization rate is high, and a manufacturing cost of the large-sized OLED display devices is further reduced.

3. Furthermore, each of the pixel units of the display panel further includes the first pixel definition layer and the second pixel definition layer therein, the first pixel definition layer separates adjacent pixel units, and the second pixel definition layer separates the sub-pixels in each of the pixel units, thereby preventing color miscibility from occurring between adjacent pixel units and sub-pixels of different colors in each of the pixel units, which affects the display quality of the display panel.

4. Furthermore, as the first pixel definition layers are disposed between adjacent pixel units, and the height of the first pixel definition layers are greater than the height of the second pixel definition layer and are greater than the height of the anode layer, the areas of each of the sub-pixels are clearly divided, and printing accuracy requirements of products on printing devices are reduced.

DESCRIPTION OF DRAWINGS

In order to more clearly illustrate the technical solutions in the embodiments of the present disclosure, the drawings used in the description of the embodiments will be briefly described below. It is obvious that the drawings in the following description are only some embodiments of the present disclosure. Other drawings can also be obtained by those skilled in the art based on these drawings without paying any creative effort.

DETAILED DESCRIPTION OF EMBODIMENTS

Figure 1:
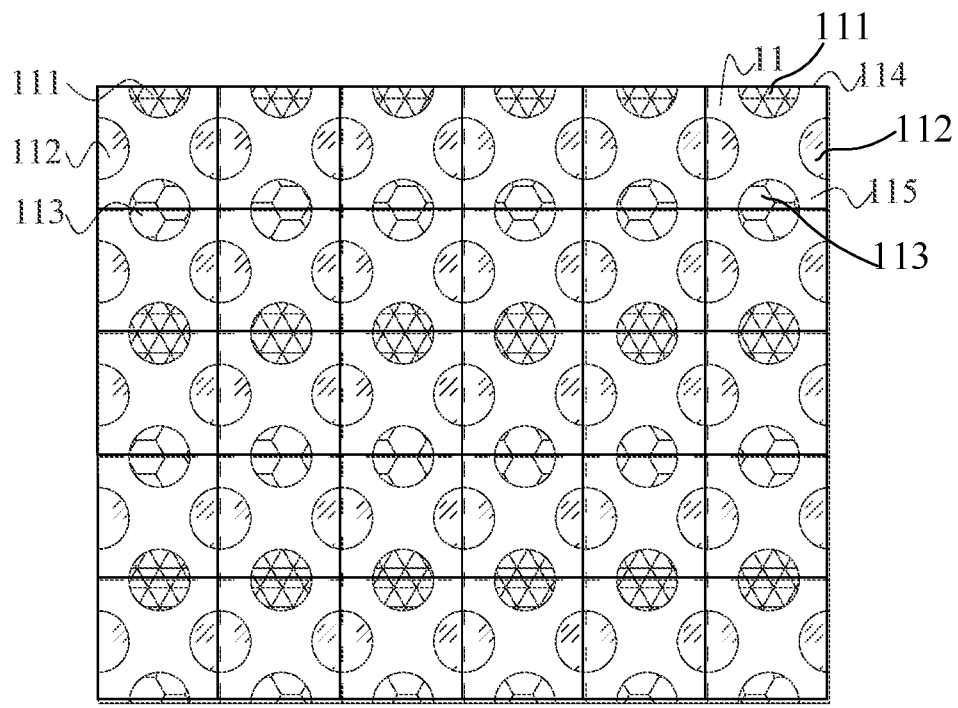
FIG. 1 is a schematic view of a first pixel structure of a display panel provided by an embodiment of the present disclosure.

The technical solutions in the embodiments of the present disclosure will be clearly and completely described with reference to accompanying drawings in the embodiments of the present disclosure. Obviously, described embodiments are only a part of the embodiments of the present disclosure, but not all the embodiments. Based on the embodiments in the present disclosure, all other embodiments obtained by those skilled in the art without creative work fall into protection scope of the present disclosure.

In the description of the present disclosure, it should be understood that terms such as "center," "longitudinal," "lateral," "length," "width," "thickness," "upper," "lower," "front," "rear," "left," "right," "vertical," "horizontal," "top," "bottom," "inside," "outside," "clockwise," "counterclockwise" as well as derivative thereof should be construed to refer to the orientation as then described or as shown in the drawings under discussion. These relative terms are for convenience of description, do not require that the present disclosure be constructed or operated in particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified.

The present disclosure provides a display panel and a method for manufacturing the display panel. For details, refers to FIG. 1 to FIG. 7.

During manufacturing conventional display panels, on one hand, if IJP technology is used, firstly, the material utilization rate of IJP technology is high, and a manufacturing cost is also high; furthermore, dimensions of each groove in the pixel units are too small, so solutions in different grooves will be mixed, thereby causing obvious differences in brightness and chromaticity during display and seriously affecting quality of products. On the other hand, the luminous efficiency of the blue sub-pixels in each of the pixel units is low, which restricts the mass production of the IJP OLED display panels. Therefore, the present disclosure provides a display panel and a method for manufacturing the display panel to solve the above problems.

Referring to FIG. 1, it is a schematic view of a first pixel structure of a display panel provided by an embodiment of the present disclosure. The present disclosure provides a display panel. The display panel includes a plurality of pixel units 11, wherein each of the pixel units 11 further includes first sub-pixels 111, second sub-pixels 112, third sub-pixels 113, first pixel definition layers 114, and a second pixel definition layer 115. The first pixel definition layers 114 are disposed around each of the pixel units 11, and each of the pixel units is enclosed by one of the first pixel definition layers into a rectangle. The second pixel definition layer 115 is disposed in each of the first pixel definition layers 114 and between the first sub-pixels 111, the second sub-pixels 112, and the third sub-pixels 113. That is, the first sub-pixels 111, the second sub-pixels 112, and the third sub-pixels 113 are provided with the second pixel definition layer 115 there between, wherein the second pixel definition layer 115 is disposed in each of the first pixel definition layers 114.

In some embodiments of this present disclosure, areas of the third sub-pixels 113 are greater than areas of the first sub-pixels 111, and the areas of the first sub-pixels 111 are same as areas of the second sub-pixels 112. Since a luminous efficiency of the third sub-pixels 113 is generally lower than that of the first sub-pixels 111 and the second sub-pixels 112, in order to enhance the luminous efficiency of the third sub-pixels 113 and improve the display quality of the display panel, in this present disclosure, the areas of the third sub-pixels 113 are increased by increasing the areas of the third sub-pixels 113. Compared with original pixel units, the areas of the third sub-pixels 113 in each of pixel units are greater than the areas of the first sub-pixels 111 and are greater than the areas of the second sub-pixels 112.

In some embodiments of this present disclosure, in each of the pixel units 11, the areas of the third sub-pixels 113 are twice the areas of the first sub-pixels 111, and the areas of the third sub-pixels 113 are twice the areas of the second sub-pixels 112. That is, the luminous efficiency of the third sub-pixels are increased to twice the original luminous efficiency of the third sub-pixels.

Furthermore, in each of the pixel units 11, the first sub-pixels 111, the second sub-pixels 112, and the third sub-pixels 113 are all semicircular. In another embodiment of the present disclosure, in each of the pixel units 31, shapes of the first sub-pixels 311, the second sub-pixels 312, and the third sub-pixels 313 may also be rectangular. The shapes of sub-pixel units are preferably an axially symmetrical pattern, so that the ink can be completely set in each of the sub-pixel units during IJP to prevent a leakage of printing ink. For details, refer to FIG. 1 and FIG. 3.

Figure 2:
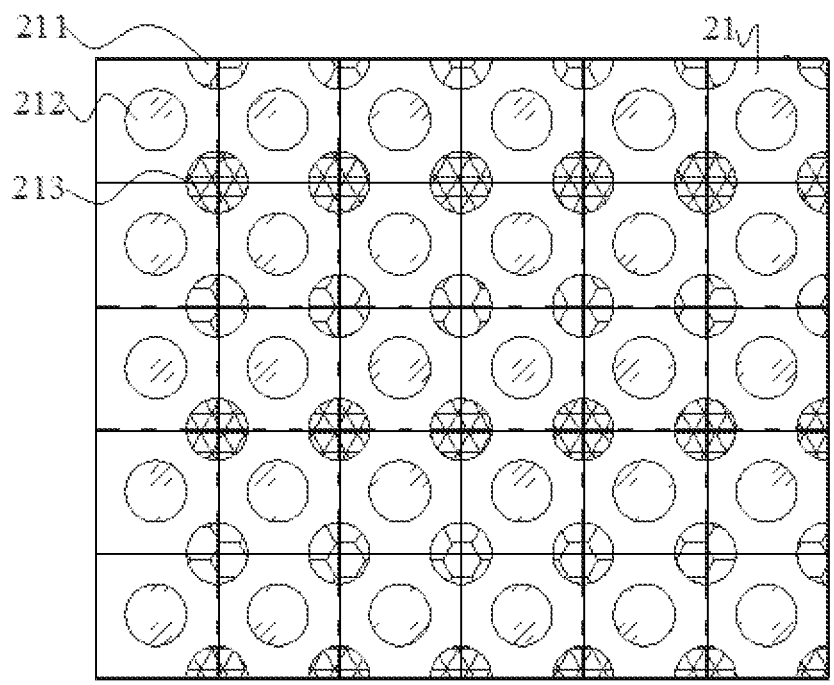
FIG. 2 is a schematic view of a second pixel structure of a display panel provided by an embodiment of the present disclosure.
Figure 3:
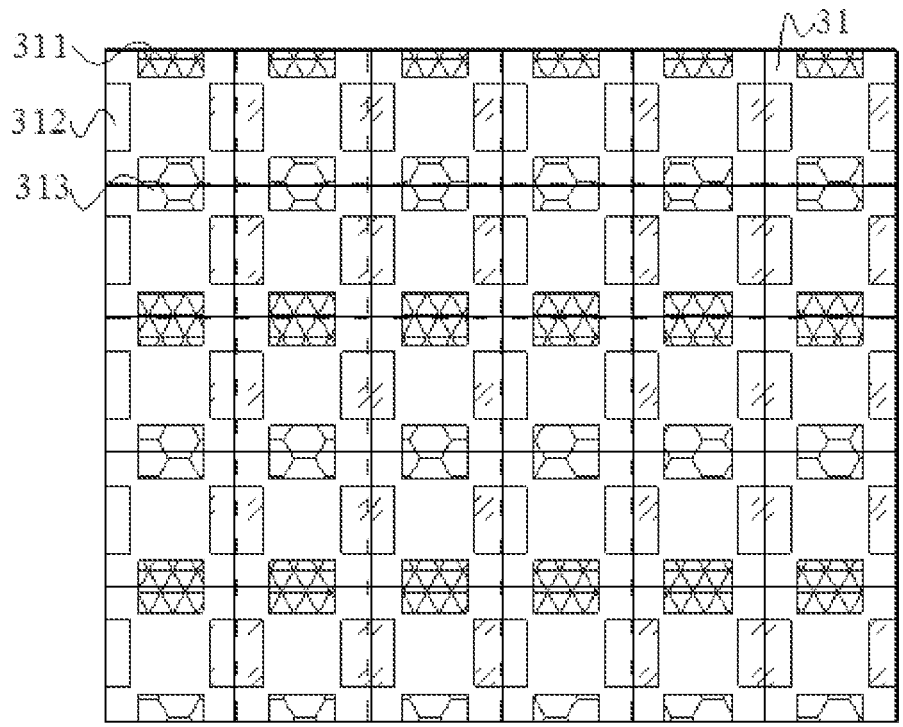
FIG. 3 is a schematic view of a third pixel structure of a display panel provided by an embodiment of the present disclosure.
Figure 4:
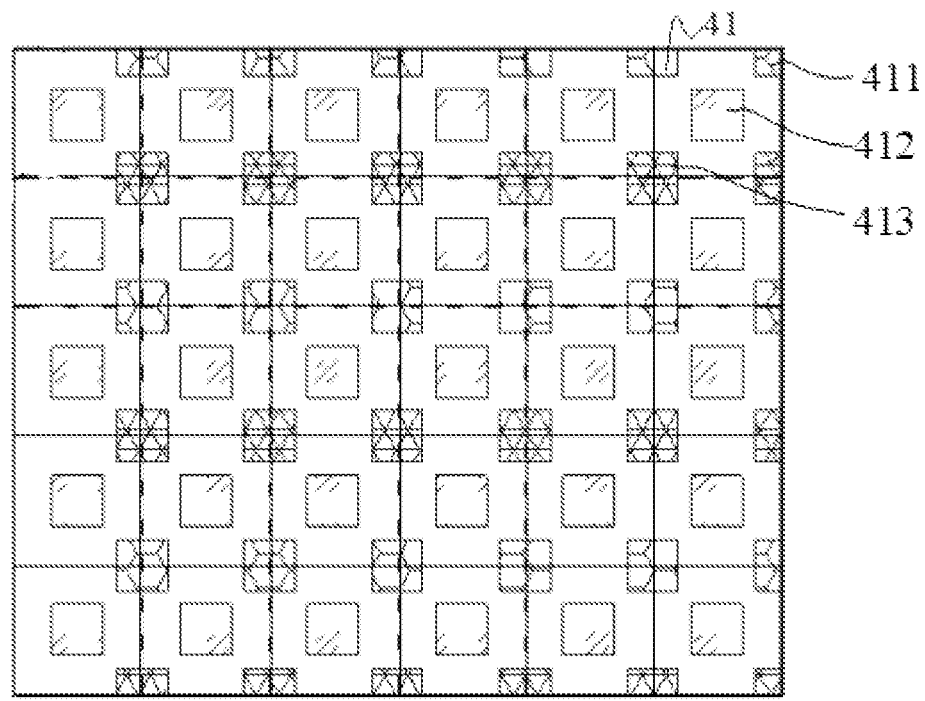
FIG. 4 is a schematic view of a fourth pixel structure of a display panel provided by an embodiment of the present disclosure.

Referring to FIG. 2, in some embodiments of this present disclosure, in each of the pixel units 21, the areas of the third sub-pixels 213 are four times the areas of the first sub-pixels 211, and the areas of the third sub-pixels 213 are four times the areas of the second sub-pixels 212. That is, the luminous efficiency of the third sub-pixels 213 at this time is four times the original luminous efficiency of the third sub-pixel 213, and the areas of the first sub-pixels 211 and the second sub-pixels 212 are halved compared to their original areas. Therefore, at this time, the luminous efficiency of the third sub-pixels 213 increases relatively overall.

Furthermore, in each of the pixel units 21, shapes of the third sub-pixels 213 are circular, and shapes of the first sub-pixels 211 and the second sub-pixels 212 are quarter-circular. Similarly, the areas of the first sub-pixels 211 and the areas of the second sub-pixels 212 are halved compared to their original areas, and the areas of the third sub-pixels 213 are four times the original the areas of third sub-pixels 213. Therefore, the luminous efficiency of the third sub-pixels 213 are enhanced.

In some embodiments of this present disclosure, in each of the pixel units 41, the third sub-pixels 413, the first sub-pixels 411, and the second sub-pixels 412 are rectangular, the areas of the third sub-pixels 413 are four times areas of the first sub-pixels 411, and the areas of the third sub-pixels 413 are four times areas of the second sub-pixels 412. For details, refer to FIG. 4.

Figure 5:
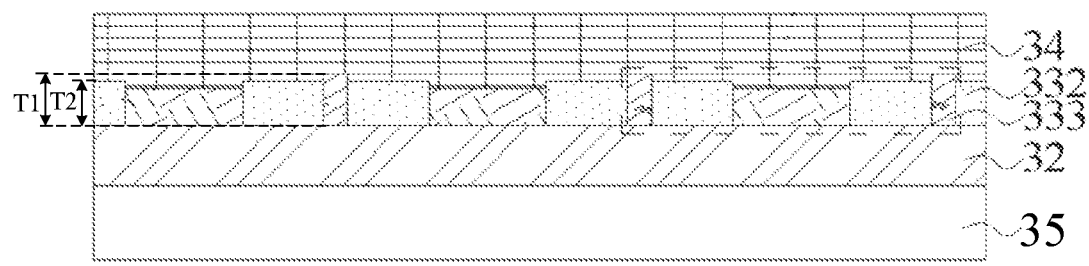
FIG. 5 is a schematic view of a display panel provided by an embodiment of the present disclosure.

Referring to FIG. 5, it is a schematic view of a display panel provided by the present disclosure. A height of each of the first pixel definition layers 333 is greater than a height of the second pixel definition layer 332, and each of the first pixel definition layers 333 and the second pixel definition layer 332 has a certain preset thickness.

Furthermore, the preset thickness of the second pixel definition layer 332 ranges from 0.5 um to 1 um; the preset thickness of the first pixel definition layer 333 ranges from 1 um to 2 um. That is, the height of each of the first pixel definition layer 333 is greater than the height of the second pixel definition layer 332, and the height of the second pixel definition layer 332 is greater than a height of each of the sub-pixel units, in order to prevent the color miscibility or cross-color between each of the pixel units or between each of adjacent sub-pixel units.

Furthermore, a thin film transistor layer 32 configured to drive is disposed on a side of the substrate 35, and a thin film encapsulation layer 34 is also disposed on a side of the first pixel definition layers 333 and the second pixel definition layer 332 facing away from the substrate 35. The thin film encapsulation layer 34 can better protect the OLED display panel and prevent each of film layers in the OLED display panel from being corroded by external water and oxygen, which may damage the screen quality and affect user experience. It should be understood that, the preset thickness of the first pixel definition layers 333 is the thickness T1 of the first pixel definition layers 333 between the thin film transistor layer 32 and the thin film encapsulation layer 34, and the preset thickness of the second pixel definition layers is the thickness T2 of the second pixel definition layers 332 between the thin film transistor layer 32 and the thin film encapsulation layer 34.

Furthermore, the third sub-pixels are blue pixels, and the first sub-pixels and the second sub-pixels are respectively one of red pixels or green pixels.

Figure 7:
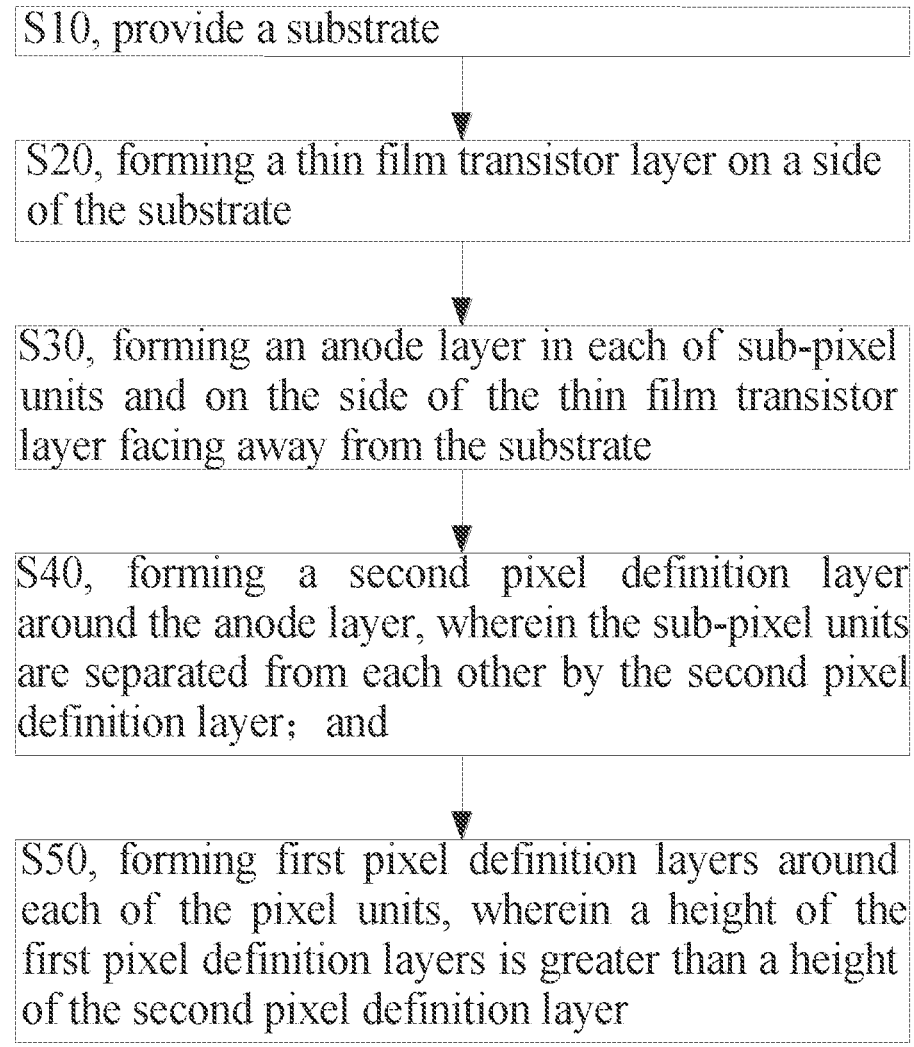
FIG. 7 is a flow chart of a method for manufacturing a display panel provided by an embodiment of the present disclosure.

Referring to FIG. 7, the present disclosure further provides a method for manufacturing a display panel, the display panel adopts the above-mentioned display panel, and the method includes following steps:

S10, providing a substrate. The substrate may be a glass substrate or a flexible substrate, such as a polyimide (PI) material substrate. The flexible substrate is more conducive to flexible folding and extension of the display panel.

Figure 6:
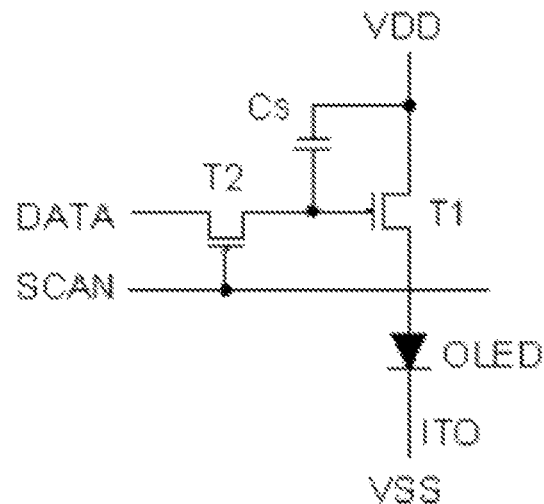
FIG. 6 is a schematic view of a 2T1C pixel driving circuit provided by an embodiment of the present disclosure.

S20, forming a thin film transistor layer on a side of the substrate. The thin film transistor layer is configured to drive each of the pixel units, that is, the first sub-pixels, the second sub-pixels, and the third sub-pixels are all driven by thin film transistors, thereby performing individual current or voltage control on each of the sub-pixel units sub-pixel units to achieve functions of lighting switches. A variety of pixel drive circuit structures can be used, preferably a 2T1C drive circuit design for control, as shown in FIG. 6 for details. Because OLEDs are current devices, current cannot be stored stably. Meanwhile, voltage can be temporarily stored with a capacitor, so a thin film transistor is needed to convert the stored voltage into current. As shown by T1 in FIG. 6, it is configured to convert a gate voltage of the T1 into a current flowing through the T1, and the T1 and the OLED devices are connected in series. That is, the current of the T1 is a current when the OLED device is working. The gate voltage of the T1 is a data voltage, which comes from data lines, that is, the data lines (DATA) in the figure, but there are many rows of signals on the data lines (DATA), so a thin film transistor is needed to selectively connect data signals to a gate electrode of T1, that is, the thin film transistor refers to T2 in FIG. 6. When scan lines (SCAN) is on, the data signals enter the gate electrode of the T1. When the scan signal is off, the gate voltage of the T1 has nothing to do with the data signals, and the gate voltage is maintained by a capacitor Cs. Without the capacitor Cs, the gate voltage of the T1 will easily drift. Therefore, the OLEDs drive circuit needs at least the 2T1C circuit to achieve stable display.

S30, forming an anode layer in each of the sub-pixel units and on a side of the thin film transistor layer facing away from the substrate. The anode layer adopts an indium tin oxide (ITO) transparent anode, which can conduct electricity without blocking the light emitted by the sub-pixels with different colors.

S40, forming a second pixel definition layer around the anode layer, and the sub-pixel units being separated from each other by the second pixel definition layer. The second pixel definition layer is disposed in each of the pixel units and between the sub-pixels with different colors. A height of the second pixel definition layer is greater than a height of each of the first sub-pixels, is greater than a height of each of the second sub-pixels, and is greater than a height of each of the third sub-pixels, and the sub-pixels with different colors are separated to prevent color miscibility between the different sub-pixel units.

S50, forming first pixel definition layers around each of the pixel units, and a height of each of the first pixel definition layers is greater than the height of the second pixel definition layer. The first pixel definition layers are disposed around each of the pixel units to define each of the pixel units as a rectangle, so that each of the pixel units can perform a single current and voltage control, and also prevents an occurrence of color compatibility between different sub-pixel units.

Compared with the prior art, the display panel and the method for manufacturing the display panel provided by the present disclosure have following beneficial effects:

In the display panel provided by the present disclosure, the adjacent pixel units are separated by the first pixel definition layers, and each of pixel units is provided with a plurality of sub-pixels with different colors and sizes, wherein the areas of the third sub-pixels are greater than the areas of the first sub-pixels. The areas of the third sub-pixels are further greater than the areas of the second sub-pixels. Therefore, the luminous efficiency of the third sub-pixels in each of the pixel units are improved, thereby improving the display quality of the display panel. In the method for manufacturing the display panel provided in the present disclosure, each of the pixel units are prepared by an IJP method, a material utilization rate is high, and a manufacturing cost of a large-sized OLED display is further reduced. Furthermore, each of the pixel units of the display panel further includes the first pixel definition layer and the second pixel definition layer. The first pixel definition layers separate adjacent pixel units, and the second pixel definition layer separates the sub-pixels in each of the pixel units, thereby preventing color miscibility between adjacent pixel units and between sub-pixels with different colors in each of the pixel units, which may affect the display quality of the display panel. Furthermore, as the first pixel definition layers are disposed between adjacent pixel units, and the height of each of the first pixel definition layers is greater than the height of the second pixel definition layer and is greater than the height of the anode layer, the area of each of the sub-pixels is clearly divided, thereby reducing printing accuracy requirements of products on printing devices.

The display panel and the method for manufacturing the display panel provided by the embodiments of the present disclosure have been described in detail above, in this article, specific examples are used to explain a principle and an implementation of a present disclosure. descriptions of above embodiments are only used to help understand technical solutions and core ideas of the present disclosure; those of ordinary skill in prior art should understand that they can still modify the technical solutions described in the foregoing embodiments, or equivalently replace some of technical features; and these modifications or substitutions do not deviate an essence of corresponding technical solutions from a scope of the technical solutions of the embodiments of the present disclosure.

What is claimed is:

1. A display panel, comprising:
    at least one pixel unit;
    a first pixel definition layer disposed around the at least one pixel unit, wherein the at least one pixel unit comprises a first sub-pixel, a second sub-pixel, and a third sub-pixel, and wherein the at least one pixel unit is enclosed by one of the first pixel definition layer to form a rectangular shape; and a second pixel definition layer disposed between the first sub-pixel, the second sub-pixel, and the third sub-pixel, wherein the second pixel definition layer is disposed in the first pixel definition layer;

the third sub-pixel is a blue pixel, and the first sub-pixel and the second sub-pixel are respectively a red pixel and a green pixel; and an area of the third sub-pixel is greater than an area of the first sub-pixel, the area of the first sub-pixel is same as an area of the second sub-pixel, and in the at least one pixel unit, the area of the third sub-pixel is four times the area of the first sub-pixel, and the area of the third sub-pixel is four times the area of the second sub-pixel.

2. The display panel in claim 1, wherein in each of the at least one pixel unit, a shape of the third sub-pixel is circular, and shapes of the first sub-pixel and the second sub-pixel are quarter-circular.

3. The display panel in claim 1, wherein in each of the at least one pixel unit, the third sub-pixel, the first sub-pixel, and the second sub-pixel are rectangular.

4. The display panel in claim 1, wherein a height of the first pixel definition layer is greater than a height of the second pixel definition layer.

5. The display panel in claim 4, wherein a preset thickness of the second pixel definition layer ranges from 0.5 um to 1 um, and a preset thickness of the first pixel definition layer ranges from 1 um to 2 um.

6. A method for manufacturing a display panel, wherein the display panel adopts the display panel in claim 1, and the method comprises following steps:

S10, provide a substrate;

S20, forming a thin film transistor layer on a side of the substrate;

S30, forming an anode layer in each sub-pixel unit and on a side of the thin film transistor layer facing away from the substrate;

S40, forming the second pixel definition layer around the anode layer, wherein the sub-pixel units are separated from each other by the second pixel definition layer; and S50, forming the first pixel definition layer around each of the at least one pixel unit, wherein a height of the first pixel definition layer is greater than a height of the second pixel definition layer.

7. A display panel, comprising:

at least one pixel unit;

a first pixel definition layer disposed around the at least one pixel unit, wherein the at least one pixel unit comprises a first sub-pixel, a second sub-pixel, and a third sub-pixel, and wherein the at least one pixel unit is enclosed by the first pixel definition layer to form a rectangular shape; and a second pixel definition layer disposed between the first sub-pixel, the second sub-pixel, and the third sub-pixel, wherein the second pixel definition layer is disposed in the first pixel definition layer; and an area of the third sub-pixel is greater than an area of the first sub-pixel, the area of the first sub-pixel is same as an area of the second sub-pixel, and in the at least one pixel unit, the area of the third sub-pixel is four times the area of the first sub-pixel, and the area of the third sub-pixel is four times the area of the second sub-pixel.

8. The display panel in claim 7, wherein in the at least one pixel unit, a shape of the third sub-pixel is circular, and shapes of the first sub-pixel and the second sub-pixel are quarter-circular.

9. The display panel in claim 7, wherein in each of the at least one pixel unit, the third sub-pixel, the first sub-pixel, and the second sub-pixel are rectangular.

10. The display panel in claim 7, wherein a height of the first pixel definition layer is greater than a height of the second pixel definition layer.

11. The display panel in claim 10, wherein a preset thickness of the second pixel definition layer ranges from 0.5 um to 1 um, and a preset thickness of the first pixel definition layer ranges from 1 um to 2 um.

* * * * *